United States Patent
Kenington et al.

(10) Patent No.: US 7,295,819 B2
(45) Date of Patent: Nov. 13, 2007

(54) SIGNAL SAMPLE ACQUISITION TECHNIQUES

(75) Inventors: Peter Blakeborough Kenington, Chepstow (GB); Jonathan Paul Rogers, Bristol (GB); John Bishop, Derbyshire (GB); Antony James Smithson, Gloucestershire (GB)

(73) Assignee: Andrew Corporation, West Chester, IL (US)

( * ) Notice: Subject to any disclaimer, the term of this patent is extended or adjusted under 35 U.S.C. 154(b) by 774 days.

(21) Appl. No.: 10/386,057

(22) Filed: Mar. 11, 2003

(65) Prior Publication Data

US 2004/0180634 A1 Sep. 16, 2004

(51) Int. Cl.
*H01Q 11/12* (2006.01)
*H04B 1/04* (2006.01)

(52) U.S. Cl. .................. 455/127.2; 455/113; 455/114.3

(58) Field of Classification Search ................ 455/108, 455/113, 114.2, 114.3, 118, 126, 295, 127.2; 330/2, 107, 136, 149; 375/296, 297, 300, 375/219, 269

See application file for complete search history.

(56) References Cited

U.S. PATENT DOCUMENTS

| | | | |
|---|---|---|---|
| 6,275,685 B1 * | 8/2001 | Wessel et al. | 375/296 |
| 6,359,508 B1 * | 3/2002 | Mucenieks | 330/149 |
| 6,407,635 B2 * | 6/2002 | Mucenieks et al. | 330/149 |
| 6,714,073 B2 | 3/2004 | Suto et al. | |
| 6,717,464 B2 * | 4/2004 | Fudaba et al. | 330/149 |
| 6,759,902 B2 | 7/2004 | Kossor | |
| 6,798,843 B1 * | 9/2004 | Wright et al. | 375/296 |
| 6,919,764 B2 * | 7/2005 | Kenington et al. | 330/149 |
| 6,993,301 B1 * | 1/2006 | Kenington et al. | 455/114.3 |
| 2002/0080891 A1 | 6/2002 | Ahn et al. | |
| 2004/0032296 A1 | 2/2004 | Akaiwa | |
| 2004/0179587 A1 * | 9/2004 | Kenington et al. | 375/269 |

FOREIGN PATENT DOCUMENTS

| | | |
|---|---|---|
| EP | 1262017 | 8/2001 |
| EP | 1425849 | 3/2003 |
| GB | 2 376 584 | 12/2002 |
| WO | WO 00/70748 | 11/2000 |
| WO | WO 01/08297 | 2/2001 |

OTHER PUBLICATIONS

International Search Report, received Aug. 23, 2004.
British Search Report, Dated Aug. 17, 2004.

\* cited by examiner

*Primary Examiner*—Quochien B. Vuong
(74) *Attorney, Agent, or Firm*—Wood, Herron & Evans, LLP

(57) ABSTRACT

A sample acquisition apparatus for sampling first and second signals within a signal processing arrangement, includes a sampler for capturing sections of the waveforms of both the first and second signals, a switch for alternating correction of the sampler to a point in the arrangement where said first signal can be sampled and a point in said arrangement where said second signal can be sampled. A timer for timing the operation of the switch causes the sampler to capture a first waveform section of the first signal and a second waveform section of the second signal, wherein the second signal is responsive to the first signal and the timing of the switch is such that the second section includes a portion that has been generated in response to the first section.

15 Claims, 10 Drawing Sheets

SIGNAL SAMPLE ACQUISITION TECHNIQUES

FIELD OF THE INVENTION

The invention relates to techniques for sampling signals that appear within signal processing arrangements. For example, samples taken from a signal processing arrangement can be used to assess the operation of the arrangement with a view to exerting control over the arrangement to obtain a desired degree of performance from the arrangement.

The invention finds application in a wide variety of signal processing fields. One particular field where the invention may be used is that of amplifier control in a wireless communications setting.

DESCRIPTION OF RELATED ART

A radio transmitter typically includes a radio frequency power amplifier (RFPA) for boosting the power of radio frequency (RF) signals to be transmitted. The RFPA will, to a greater or lesser extent, exert a distorting effect upon the RF signals that it amplifies. This distorting effect usually needs to be controlled to ensure that the transmitter meets any prevailing standards regarding RF interference. This distorting effect normally manifests itself mainly in the form of one or two characteristics, namely AM-AM distortion and AM-PM distortion.

AM-AM distortion occurs where the gain of the RFPA varies as a function of the amplitude of the input signal. Usually, the gain will decrease as the amplitude of the input signal increases. This is called a compressive gain characteristic.

AM-PM distortion refers to the case where the phase of the output signal of the RFPA varies as a function of the amplitude of the input signal. That is to say, amplitude modulation (AM) in the input signal causes phase modulation (PM) in the output signal.

It is common practice to use a control scheme which controls the distortion produced by an RFPA. Two main techniques for controlling an RFPA are the predistortion technique and the feed-forward technique.

In the predistortion technique, the input signal to the RFPA is subjected to controlled distortion that is calculated to be cancelled out by the distorting effect of the RFPA such that the output signal of the RFPA is substantially undistorted.

In the feed-forward technique, it is usual for a "feed-forward" signal, derived from the input signal to the RFPA, to be injected into the output signal of the RFPA in order to correct distortion appearing in the output signal.

Various control schemes have been proposed for both predistorters and feed-forward systems in an effort to improve the accuracy of distortion removal. However, an increase in the effectiveness of a distortion control scheme will usually come at the expense of an increase in cost.

It is an object of the invention to provide a signal sampling technique that can lead to relatively accurate assessment of the condition of a signal processing arrangement, such as an RFPA in a radio transmitter, at relatively low cost.

SUMMARY OF THE INVENTION

According to one aspect, the invention provides apparatus for sampling first and second signals within a signal processing arrangement, said apparatus comprising a sampler for sampling sections of the waveforms of both the first and second signals, a switch for alternating connection of the sampler to a point in the arrangement where said first signal can be sampled and a point in said arrangement where said second signal can be sampled and a timer for timing the operation of the switch to cause the sampler to sample a first waveform section of said first signal and a second waveform section of said second signal, wherein said second signal is responsive to said first signal and said timer is arranged to utilise a propagation delay between said points so that said second section at least comprises a portion that has been generated in response to said first section.

The invention thus provides a technique for acquiring samples from a signal processing arrangement in a manner which allows relatively accurate information to be obtained from the arrangement without recourse to relatively expensive technology for the implementation of the sampler.

In some embodiments, the timer is arranged to time the operation of the switch such that the sampler samples the first and second sections consecutively. However, in other embodiments, the timer may be arranged to alternate the connection of the switch between the first and second points in a manner such that the sampler samples the first and second sections non-consecutively.

In some embodiments, a controller is arranged to use the samples of the first and second sections to produce one or more control signals for controlling the operation of the arrangement. In such a variant, the controller may comprise a memory for storing values obtained from the samples and the controller may be arranged to time-align those values that relate to the first section with those values that relate to the second section in preparation for deriving from the values one or more control signals for application to the signal processing arrangement.

In some embodiments, a controller can be used to obtain from the samples values of a parameter, to allocate the values into bins and then average values within the bins. By producing bin averages in this way, the effect of random errors arising in the sampling process performed by the sampler can be ameliorated.

In some embodiments, a controller can be used to obtain from the samples values of a parameter, to allocate the values into bins and then use ideal values of the parameter for the bins in order to assess the contents of the bins. In such a scenario, the assessment may involve comparing the ideal value of a given bin with an average of the values allotted to the bin.

One of the preferred applications of the invention is for the monitoring of the performance of amplifiers, say RFPAs in radio transmitter circuits. In such a scenario, the first and second signals may be the input and output signals, respectively, of the amplifier.

BRIEF DESCRIPTION OF THE DRAWINGS

By way of example only, several embodiments of the invention will now be described by reference to the accompanying drawings, in which.

DETAILED DESCRIPTION OF THE PREFERRED EMBODIMENTS

Figure 1:
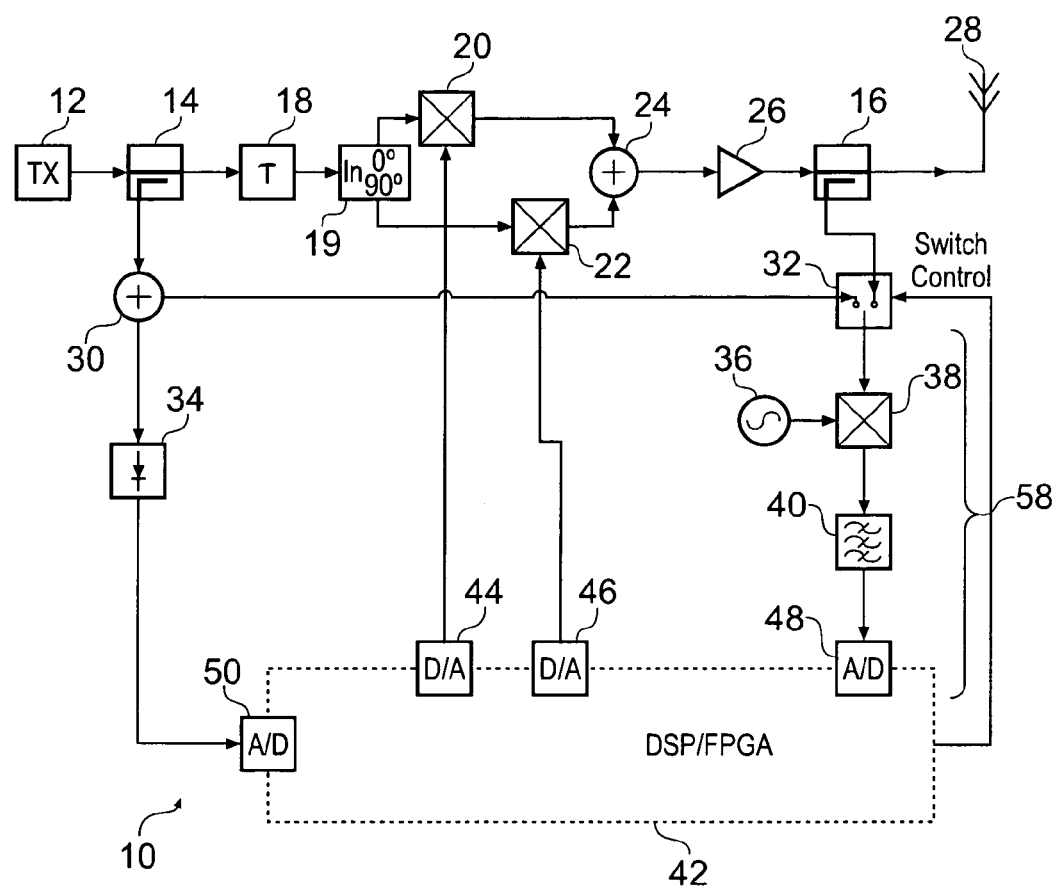
FIG. 1 is a block diagram of an RF signal processing scheme within a base station of a mobile telephone network.

FIG. 1 illustrates a base station 10 of a mobile telephone network although the figure could equally well represent a mobile telephone. In FIG. 1, the parts of the base station 10 that are shown are only those parts that are closely involved in controlling the process of amplifying RF signals that are to be transmitted from the base station. For example, FIG. 1 does not show a receiver for demodulating RF signals that have been transmitted to the base station.

As shown in FIG. 1, the base station 10 comprises a main transmission path (MTP) and a predistortion control scheme. The MTP includes a transmitter 12, two splitters 14 and 16, a delay line 18, a quadrature splitter 19, two multipliers 20 and 22, a combiner 24, an RFPA 26 and an antenna 28. The predistortion control scheme comprises a splitter 30, an RF switch 32, an envelope detector 34, a local oscillator (LO) 36, a multiplier 38, a low-pass or band-pass filter 40 and a digital processing facility (DPF) 42. Two digital to analogue converters (DACs) 44 and 46 allow the DPF 42 to send signals into the analogue domain and two analogue to digital converters (ADCs) 48 and 50 allow the DPF 42 to receive signals from the analogue domain.

The transmitter 12 produces an RF signal that is to be transmitted from the base station 10. The RF signal is modulated with information such as encoded, digitised speech. In the present example, the transmitter 12 uses a code division multiple access (CDMA) technique to generate a group of spread spectrum signals, each conveying different information, which are summed together to produce the RF output of the transmitter 12.

The RF signal from the transmitter 12 travels through the splitter 14 and the delay line 18 to the quadrature splitter 19. Together, the quadrature splitter 19, the multipliers 22 and 24 and the combiner 24 constitute a vector modulator for making adjustments to the RF output signal from the transmitter 12. From the vector modulator, the modified version of the RF output signal of the transmitter 12 proceeds to the RFPA 26 where the power of the signal is amplified. The amplified signal that is produced by the RFPA 26 then passes through the splitter 16 and is transmitted from the antenna 28.

The RFPA 26 tends to create AM-AM and AM-PM distortion in its output signal. The purpose of the vector modulator is to adjust the amplitude and phase of the input signal to the RFPA 26 so as to eliminate any AM-AM and AM-PM distortion that the RFPA 26 would otherwise produce in its output signal. The vector modulator is said to "predistort" the input signal to the RFPA 26 in order to counter-act the distorting effect of the RFPA 26.

To predistort the input signal to the RFPA 26, the vector modulator first resolves the RFPA input signal into an in-phase (I) component and a quadrature-phase (Q) component. The I and Q components are modified by the multipliers 20 and 22, respectively. The multiplier 20 modifies the I component by multiplying it with an I channel correction signal received from DAC 44 of the DPF 42. The multiplier 22 modifies the Q component by multiplying it with a Q channel correction signal received from DAC 46 of the DPF 42. The modified versions of the I and Q components are then combined to produce a predistorted version of the RFPA input signal. This predistorted signal is then supplied to the RFPA 26 where the power of the signal is amplified.

If the base station is operating correctly, then the predistortion of the input signal to the RFPA 26 cancels out the distortion that would otherwise appear in the output of the RFPA 26.

As mentioned earlier, the DPF 42 produces the I and Q channel correction signals that are used to predistort the RFPA input signal in the vector modulator. The DPF 42 performs two main processes, namely a predistortion generation process and a correction process. The predistortion process generates the I and Q channel correction signals and the correction process is responsible for maintaining the predistortion generation process so that the amount of residual distortion appearing in the RFPA output signal is kept as low as possible. The DPF 42 comprises a digital signal processor (DSP) and a field programmable gate array (FPGA) that share the tasks involved in the predistortion generation process and the correction process between them. The allocation of these tasks to the DSP or the FPGA can vary from one implementation to another. Other possibilities include the use of an application specific integrated circuit (ASIC) in place of the FPGA.

The DPF 42 is linked to the MTP by the splitters 14 and 16 which provide signals that drive the predistortion generation process and the correction process. The splitter 14 diverts a version of the transmitter output signal away from the MTP and supplies it to splitter 30. The splitter 16 diverts a version of the RFPA output signal away from the MTP and supplies it to a terminal of the RF switch 32. Splitter 30 supplies a version of the transmitter output signal to both the envelope detector 34 and a terminal of the RF switch 32. The envelope detector 34 senses the envelope of the version of the transmitter output signal that it receives and supplies an envelope signal, indicative of the sensed envelope and its variations, to ADC 50 for use within the DPF 42.

The RF switch 32 receives versions of the transmitter output signal and the RFPA output signal from splitters 14 and 16, respectively. The switch 32 is controlled by a signal from the DPF 42 to supply either the version of the transmitter output signal or the version of the RFPA output signal to the mixer 38. Together, the mixer 38, the LO 36 and the band-pass filter (BPF) 40 form a down-converter for reducing the frequency of the output of the switch 32. The LO 36 produces a signal with a frequency that is controlled by the DPF 42. The LO signal is mixed with the output of the switch 32 at the mixer 38. The effect of this mixing process is to produce, in the output of the mixer 38, two versions of the output signal of the switch 32, one version increased in frequency by an amount equal to the frequency of the LO signal and the other version decreased in frequency by an amount equal to the frequency of the LO signal. The purpose of the BPF 40 is to eliminate the version that has been increased in frequency, leaving only the version of the switch output that has been decreased or down-converted in frequency. The down-converted version of the switch output is then supplied to ADC 48 for use in the DPF 42.

The DPF 42 therefore receives three input signals: a signal indicative of the envelope of the transmitter output signal through ADC 50 and versions of the output signals of the transmitter 12 and the RFPA 26 through ADC 48. The signal received through ADC 50 is used to drive the pre-distortion generation process and the signals received through ADC 48 are used to drive the correction process for maintaining the predistortion generation process.

Figure 9:
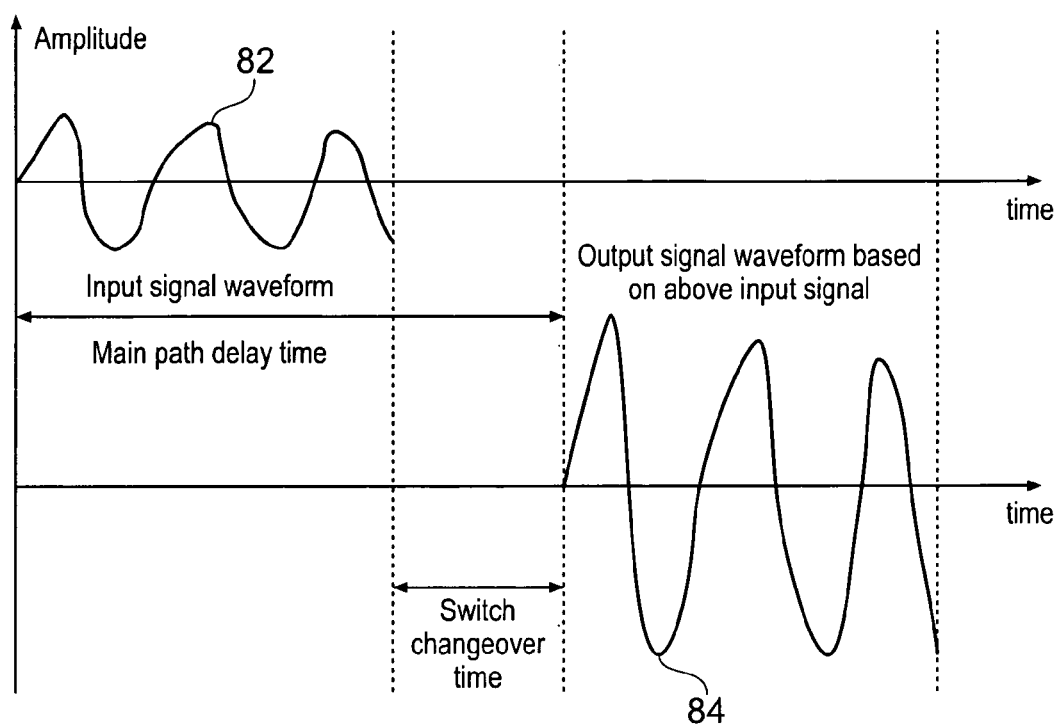
FIG. 9 is a diagram illustrating signal traces obtained from two different points in a signal processing scheme within a base station of a mobile telephone network.

A signal passing along the MTP will experience a propagation delay caused by, in the main, splitters 14 and 16, delay line 18, the vector modulator and the RFPA 26. Therefore, it is possible to control the switch 32 to connect ADC 48 to the splitter 14 to sample a point in the waveform of the signal travelling along the MTP and then to change the state of the switch 32 to connect ADC 48 to the splitter 16 in time to sample the same point in the waveform as the signal exits the RFPA 26. To illustrate this point, consider FIG. 9 which shows two signal waveforms 82 and 84. Waveform 82 is an input signal that is supplied to the RFPA 26 as detected at the one of the inputs of switch 32 that is connected to splitter 14. Waveform 84 is the output that the RPFA provides in response to waveform 82 as detected at the one of the inputs of switch 32 that is connected to splitter 16. By reference to FIG. 9, it will be apparent that the arrival of the waveform 84 at the switch 32 is delayed relative to the arrival of waveform 82 at the switch 32. This delay is attributable to the aforementioned propagation delay along the MTP. For the switch 32 to pass both waveforms 82 and 84 to its output, the process of changing the connection of the switch 32 from splitter 14 to splitter 16 must be performed prior to the arrival of waveform 84 at splitter 16. The interval during which this change-over is made is shown in FIG. 9.

In one implementation of the base station 10, Nyquist sampling the residual distortion in the RFPA output signal sets the minimum sampling rate of the ADC 48 to about 150 MHz, the propagation delays through the delay line 18 and the RFPA 26 are 500 and 15 ns respectively and the time involved in changing the switch 32 from one state to the other and in the consequential settling of the down-converter and the ADC 48 is about 50 ns. This means that if the ADC 48 is connected to the splitter 14, then tens of samples of the transmitter output can be collected by the ADC 48 before the process of changing the state of the switch 32 must be begun to allow the ADC 48 to be connected to the splitter 16 in time to capture a sample of the RFPA output signal that corresponds to the same point in the waveform of the signal travelling along the MTP as the first of the samples acquired via splitter 14.

In other words, the ADC 48 can, through the agency of the switch 32, capture a series of samples of the transmitter output signal and then a series of samples of the RFPA output signal, each sample in one of the series having a corresponding sample in the other series such that the two samples relate to the same point in the waveform of the signal that is travelling along the MTP. A pair of samples, one from the RFPA output signal and one from the transmitter output signal, that relate to the same point in the waveform of the signal travelling along the MTP is said to be a pseudo-simultaneous pair. In such a pair, the sample $S_A$ from the RFPA output and the sample $S_T$ from the transmitter output signal are related in that $S_A = G_1 \cdot G_2 \cdot S_T$ where $G_1$ is a coefficient representing the effect of the predistorter and $G_2$ is the gain of RFPA 26. Both $G_1$ and $G_2$ can be complex numbers implying that they each may rotate phase. In general terms, $G_1$ and $G_2$ are non-linear functions of amplitude and phase of the transmitter output signal.

The accuracy of the time-alignment of the samples within a pseudo-simultaneous pair can be enhanced by delaying one of the samples relative to the other within the DPF 42 or by adjusting the timing of the operation of the switch 32 (which is done by the DPF 42).

The process of detecting the envelope of the transmitter output signal at 34, sampling the envelope signal at ADC 50, retrieving values from the look-up tables LUT-I and LUT-Q, converting the retrieved values into analogue values for the I and Q channel correction signals at DACs 44 and 46 and applying the analogue values to the multipliers 20 and 22 within the vector modulator clearly takes a finite amount of time. It is one of the functions of the delay line 18 to compensate for the time taken for signals to propagate from splitter 14 through the detector 34 and the DPF 42 to reach the multipliers 20 and 22. The delay line 18 ensures that, at each of the multipliers, the signal coming from the quadrature splitter 19 and the DPF 42 are time-aligned such that they relate to the same point in the waveform of the transmitter output signal. However, in most cases the DPF 42 will intentionally insert a digital delay between the signals that it receives from splitters 14 and 16 to enhance the accuracy of the time-alignment of those signals within the DPF 42. The other main purpose of the delay line 18 is to facilitate pseudo-simultaneous sampling of the transmitter and RFPA output signals by ADC 48.

The processing performed by the DPF 42 on the signals received via ADCs 48 and 50 will now be discussed.

As mentioned above, the digital envelope signal produced by the ADC 50 is used to drive the predistortion generation process. The FPGA component of the DPF 42 contains an I channel look-up table LUT-I and a Q channel look-up table LUT-Q. LUT-I and LUT-Q are addressed by the digitised envelope signal. Each of the look-up tables LUT-I and LUT-Q is a table of digital values that are indexed by values of the addressing signal (which is the digitised envelope signal). Each look-up table value is associated with a range of values of the envelope signal such that when a sample of the addressing signal is presented to one of the look-up tables, the look-up table will retrieve and emit the value that it holds that is associated with the value of the sample of the addressing signal that has been presented to the look-up table.

Hence, LUT-I and LUT-Q will each receive a stream of digital samples of the envelope signal and, in response, will emit streams of samples forming the I and Q channel correction signals, respectively, that are applied to the vector modulator through DACs 44 and 46, respectively, for predistorting the input signal to RFPA 26.

In the present example, the FPGA is also responsible for quadrature demodulating the down-converted signals that reach the DPF 42 through ADC 48 (although this demodulation could be undertaken by the DSP of the DPF 42 in other embodiments). This quadrature demodulation process converts each sample emitted by ADC 48 into a quadrature doublet comprising I and Q samples for use by the DSP within the DPF 42.

The processing that is performed by the DSP on the quadrature doublets will now be described with the aid of FIG. 2.

The DSP maintains four first in, first out (FIFO) buffers 51, 52, 54 and 56. Quadrature doublets $D_T$ of the transmitter output signal from the FPGA are sent to buffers 51 and 52. Buffers 51 and 52 store the I and Q members, respectively, of each quadrature doublet that they receive. Quadrature doublets $D_A$ of the RFPA output signal from the FPGA are sent to buffers 54 and 56. Buffers 54 and 56 store the I and Q members, respectively, of each quadrature doublet that they receive.

The DPF 42 operates the switch 32 so that quadrature doublets are loaded into the buffers 51-56 in cycles. At the start of each cycle, the switch 32 is set to allow ADC 48 to sample the transmitter output signal. The FPGA then produces a series of doublets $D_T$ from the samples produced by ADC 48. A predetermined number N of the earliest doublets $D_T$ are discarded since they are unreliable as they relate to samples taken during the settling time of the system following the setting of the switch 32. The remainder of the series of doublets $D_T$ is acquired by the buffers 51 and 52. The switch is then set to allow ADC 48 to sample the RFPA output signal. The FPGA then begins producing a series of doublets $D_A$. Again, the N earliest doublets $D_A$ are discarded due to the settling time of the system and the remainder of the series of doublets $D_A$ is acquired by buffers 54 and 56. The adjustment of the switch from the state in which ADC 48 is connected to splitter 14 to the state in which the ADC 48 is connected to splitter 16 is timed such that the first doublet $D_A$ that is acquired in the cycle by buffers 54 and 56 is pseudo-simultaneous with the first doublet $D_T$ that was acquired by buffers 51 and 52 earlier in the cycle. The cycle ends when the number of doublets $D_A$ that has been acquired by buffers 54 and 56 is equal to the number of doublets $D_T$ that was acquired by the buffers 51 and 52 earlier in the cycle.

Each iteration of this cycle fills the buffers 51-56. The DSP processes the contents of the buffers in a manner that will now be explained with reference to FIG. 2.

It will be appreciated that the queues of values held in the buffers 51-56 are aligned such that if one inspects any given position in the queue of values in buffer 51 and the same position in the queues held in buffers 52-56, then the values specified in buffers 51 and 52 form a doublet $D_T$ and the values specified in buffers 54 and 56 form a doublet $D_A$ which is pseudo-simultaneous with the doublet specified by the values specified in buffers 51 and 52.

The DSP retrieves an in-phase value $I_T$ from the head of buffer 51, a quadrature-phase value $Q_T$ from the head of buffer 52, an in-phase value $I_A$ from the head of buffer 54 and a quadrature-phase value from the head of buffer 56. The values $I_T$ and $Q_T$ constitute a doublet of the transmitter output signal and the values $I_A$ and $Q_A$ constitute the pseudo-simultaneous doublet of the RFPA output signal. The DSP has therefore retrieved a pair of pseudo-simultaneous doublets from the buffers.

Using the retrieved pseudo-simultaneous doublets, the DSP then calculates values of an envelope parameter $P_T$ and two correction parameters $I_C$ and $Q_C$. The $I_C$ value is a correction factor for application to the value in LUT-I that is indexed by the value of the addressing signal that corresponds to the calculated $P_T$ value. Likewise, the $Q_C$ value is a correction factor for application to the value in LUT-Q that corresponds to the calculated $P_T$ value. The values of $I_C$, $Q_C$ and $P_T$ are calculated from the retrieved pair of doublets using the equations:

$$I_C = (I_T \times I_A) + (Q_T \times Q_A)$$

$$Q_C = (Q_T \times I_A) - (I_T \times Q_A)$$

$$P_T = (I_T \times I_T) + (Q_T \times Q_T)$$

The calculated values of $I_C$ and $Q_C$ are applied to the contents of the look-up tables (in a manner to be described later) and the DSP then proceeds to retrieve the values that are now at the head of the FIFO buffers to obtain the next pair of pseudo-simultaneous doublets. The DSP calculates $I_C$, $Q_C$ and $P_T$ values for the next doublet and applies the $I_C$ and $Q_C$ values to the appropriate look-up table entries as specified by the $P_T$ value. The DSP processes each doublet pair held by the FIFO buffers in this way. In order to complete an iteration of the correction process, the buffers are refilled several times and their contents processed as described above to produce more $I_C$, $Q_C$ and $P_T$ values.

The process of applying the $I_C$ and $Q_C$ values to the look-up tables will now be described. During its processing of the contents of the buffers, the DSP will typically generate many pairs of $I_C$ and $Q_C$ values and some of these pairs will relate to the same ranges of the addressing signal of the look-up tables. That is to say, some of the look-up table values will be modified by the application of several $I_C$ or $Q_C$ values. The $I_C$ and $Q_C$ values are applied to the look-up table values in a manner which averages the effect of several $I_C$ and $Q_C$ values where they are applied against the same look-up table entry. The DSP achieves this by producing for each look-up table entry a running average of the correction parameter value that is to be applied to the look-up table entry. Typically, the running averages are represented using words containing a number of bits which is greater than that of the samples that are produced by the ADC 48 (the reasons for this will be explained shortly). Once all of the $I_C$ and $Q_C$ values have been processed, the running averages are added to their respective look-up table entries to complete an iteration of the correction process.

The accuracy of the suppression of any distortion appearing in the RFPA output signal depends on many factors, including the digital resolution of the samples produced by ADC 48. The digital resolution of the ADC 48 is the number of bits that the converter uses to represent each sample that it produces. In general terms, an increase in the digital resolution of ADC 48 will lead to an improvement in the accuracy of the distortion suppression that is achieved. Random errors appearing within the system, for example caused by ADC quantisation, can cause the accuracy of the achieved distortion suppression to fall short of that required since the ADC 48 is producing samples containing a smaller number of bits than is actually required. Through the use in the look-up table correction process of running averages containing a higher number of bits, the difference between the actual and required numbers of bits used in the samples produced by ADC 48 can be eliminated. This equates to a relaxation in the specification of the ADC 48 for a given degree of accuracy in the achieved distortion suppression which, in turn, can lead to a reduction in the overall cost of the system.

It will be noted that the samples of the RFPA and transmitter output signals that are used to correct the look-up table values are all obtained through the pathway 58 extending between the switch 32 and the ADC 48. Therefore, any mechanisms that create errors in that pathway will affect both the samples of the RFPA output signal and the samples of the transmitter output signals such that systematic errors, i.e. errors which are reproducible in nature, that are introduced by the pathway 58 will be largely cancelled out. For example, if systematic errors caused by the pathway 58, cause a pseudo-simultaneous doublet pair to have values $D'_T$ and $D'_A$ instead of $D_T$ and $D_A$, then the DSP will determine the two correction parameters and the envelope parameter to have the values $I'_C$ and $Q'_C$ and $P'_T$ instead of $I_C$, $Q_C$ and $P_T$. However, the values $I'_C$ and $Q'_C$ are now applied to the look-up tables specified by value $P'_T$ rather than the look-up table values specified by the value $P_T$ with the result that systematic errors introduced by pathway 58 are neutralised.

Some further embodiments of the invention will now be described.

In the embodiment described above with reference to FIGS. 1 and 2, a running average value is derived for each of the $I_C$ and $Q_C$ parameters for each of the look-up table values such that the averaging process enhances the effective resolution of ADC 48. However, the averaging process need not be applied to the $I_C$ and $Q_C$ values directly. For example, in the foregoing embodiment, described with reference to FIGS. 1 and 2, a running average is derived for the $I_C$ and $Q_C$ values of all the look-up table entries in order to combat systematic errors and raise the effective resolution of ADC 48. In another embodiment, the averaging is applied to the pseudo-simultaneous pairs instead of the $I_C$ and $Q_C$ values, as will now be described.

Figure 2:
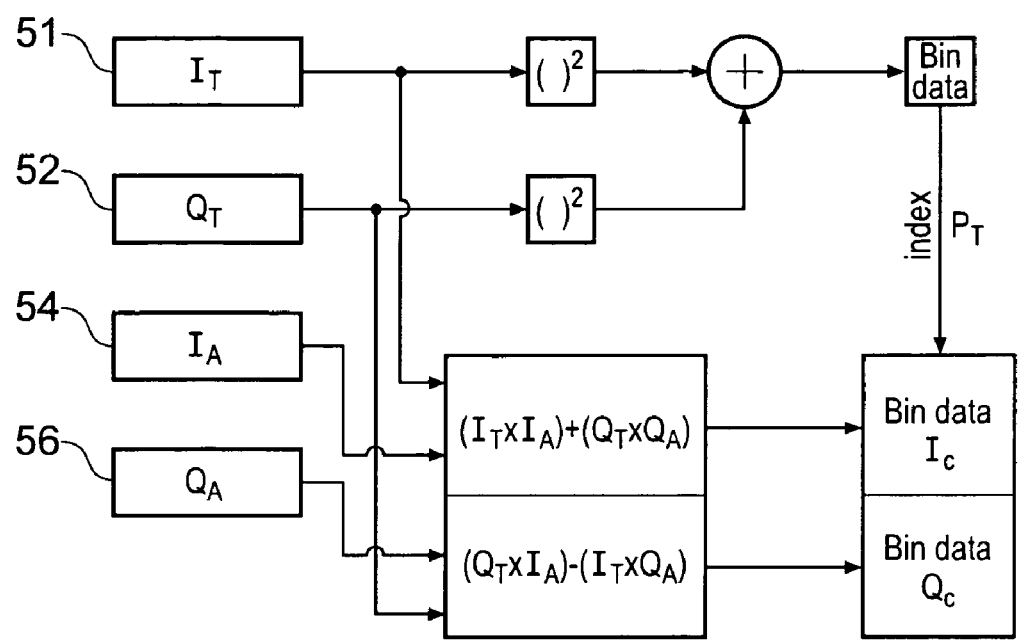
FIG. 2 is a block diagram illustrating digital signal processing operations within the digital processing facility of the base station of FIG. 1.

The modified embodiment operates in much the same way as that described in relation to FIGS. 1 and 2 up to the point at which the DSP begins to utilize the pseudo-simultaneous doublet pairs held in the FIFO buffers. In the modified embodiment, the DSP maintains a series of bins, each of which relates to a different range of the parameter $P_T$. Each of these ranges corresponds to a respective one of the ranges of the addressing signal that correspond to the entries in the look-up tables. In other words, each bin corresponds to a pair of look-up table entries, one in each of LUT-I and LUT-Q. The DSP calculates a $P_T$ value for each pseudo-simultaneous doublet pair that it retrieves and allocates the doublet pair to the bin whose range includes the calculated $P_T$ value. In this way, the DSP can allocate all the doublet pairs in the FIFO buffers to the $P_T$ bins. The DSP maintains running averages of the contents of each bin by calculating average $I_A$, average $Q_A$, average $I_T$ and average $Q_T$ values for each bin. These average values are then used to calculate average $I_C$ and $Q_C$ values for each bin and these correction values are applied to their respective look-up table entries. The averaging for the purpose of avoiding random errors is therefore conducted at a different point in the correction process compared to the embodiment that was described earlier with reference to FIGS. 1 and 2.

Figure 3:
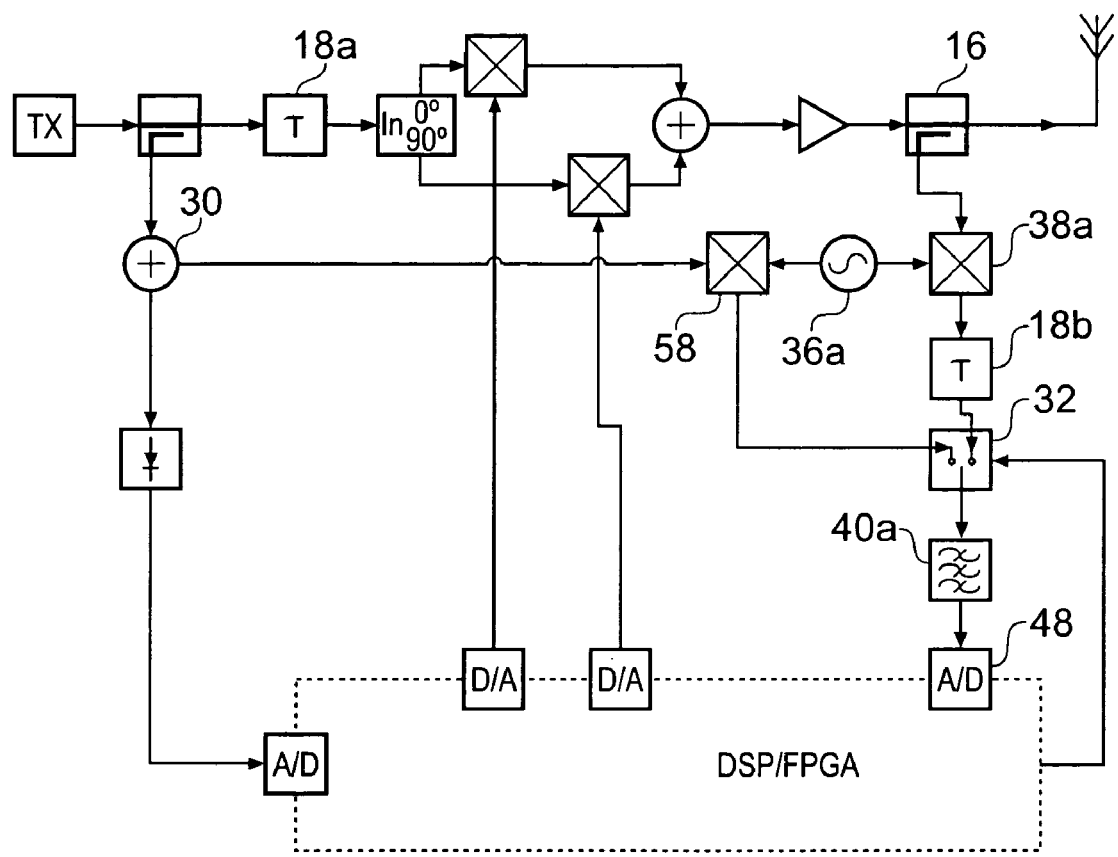
FIG. 3 is a block diagram of an RF signal processing scheme within a base station of a mobile telephone network.

FIG. 3 shows another embodiment in which the delay between the versions of the transmitter and RFPA output signals that are sent to the switch 32 is now partially implemented at an intermediate frequency (IF) rather than at the RF carrier frequency used in the MTP.

As shown in FIG. 3, the delay line 18 of FIG. 1 has been replaced by a delay element 18a and has been supplemented by an additional delay 18b. The version of the RFPA output signal that is diverted away from the MTP by splitter 16 is mixed with a signal from local oscillator 36a at mixer 38a. The output of mixer 38a contains both up-converted and down-converted versions of the RFPA output signal. The output of mixer 38a then passes through delay element 18b and is supplied to the switch 32. The version of the transmitter output signal that is made available by splitter 30 is also mixed with the output signal of the local oscillator 36a at mixer 58. The output of mixer 58, which contains both up-converted and down-converted versions of the transmitter output signal, is applied to switch 32. The output of switch 32 is filtered by BPF 40a and is then applied to ADC 48.

The mixers 38a and 58 are of the same design and they both use the same local oscillator. Therefore, the design shown in FIG. 3 largely retains the advantage that the samples of the transmitter and RFPA output signals arriving at ADC 48 are subjected to substantially the same sources of error.

The output of the switch 32 will contain both up-converted and down-converted versions of either the transmitter output signal or the RFPA output signal. The BPF 40a blocks the up-converted version of the signal. The down-converted version of the signal, which passes through the BPF 40a, is at the IF. Due to the action of the BPF 40a, ADC 48 only monitors the down-converted versions of the signal that is supplied by mixer 38a. Therefore, delay element 18b only needs to be designed to work with the version of the RFPA output that has been down-converted to the IF since the up-converted version of the RFPA output signal that is produced by mixer 38a is discarded by BPF 40a. This allows more flexibility in the design of the delay 18b since only its ability to handle IF signals is of interest. In most other respects, the system of FIG. 3 is identical to that of FIG. 1.

In FIG. 1, the delay line 18 operates on RF signals travelling along the MTP. In the alternative embodiment of FIG. 4, delay line 18 has been replaced by a delay element 18c which operates at an IF.

The RF output of the transmitter 12 is mixed with a signal from LO 36b at mixer 60. The output of mixer 60 therefore contains a version of the transmitter output signal which has been up-converted and a version of the transmitter output signal which has been down-converted to the IF for which delay element 18c is designed. Another mixer 62 is included in the MTP at the output of the vector modulator. Mixer 62 mixes the output of the vector modulator with the output of LO 36b. The output of mixer 62 contains a version of the transmitter output signal that was down-converted by mixer 60 and up-converted by mixer 62. BPF 64 allows only that version of the transmitter output signal to be supplied to the RFPA 26.

Figure 4:
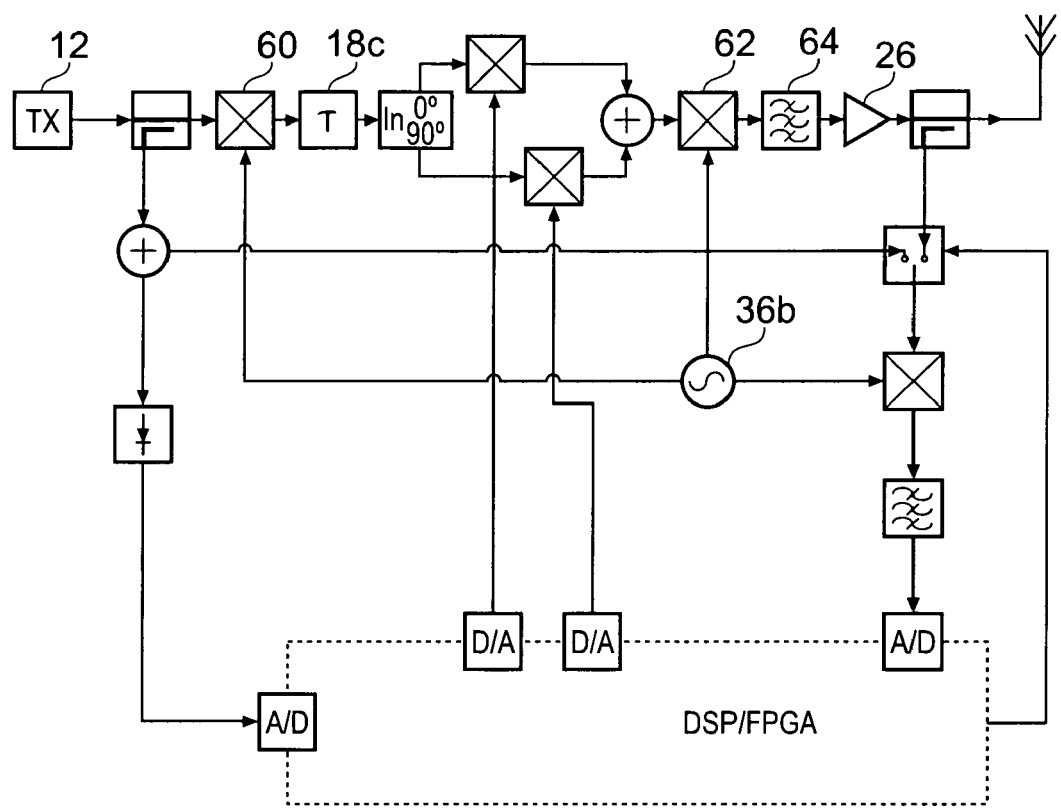
FIG. 4 is a block diagram of an RF signal processing scheme within a base station of a mobile telephone network.

Since the BPF 64 discards all versions of the transmitter output signal except the version that was down-converted to the IF by mixer 60, only the ability of the delay element 18c to handle signals at the IF is of interest, which leads to greater flexibility in the design and implementation of the delay element 18c. In FIG. 4, the vector modulator is located between mixers 60 and 62 in the MTP. However, it is possible to locate the vector modulator at the output of mixer 62. In most other respects, the system shown in FIG. 4 is the same as that shown in FIG. 1.

Figure 5:
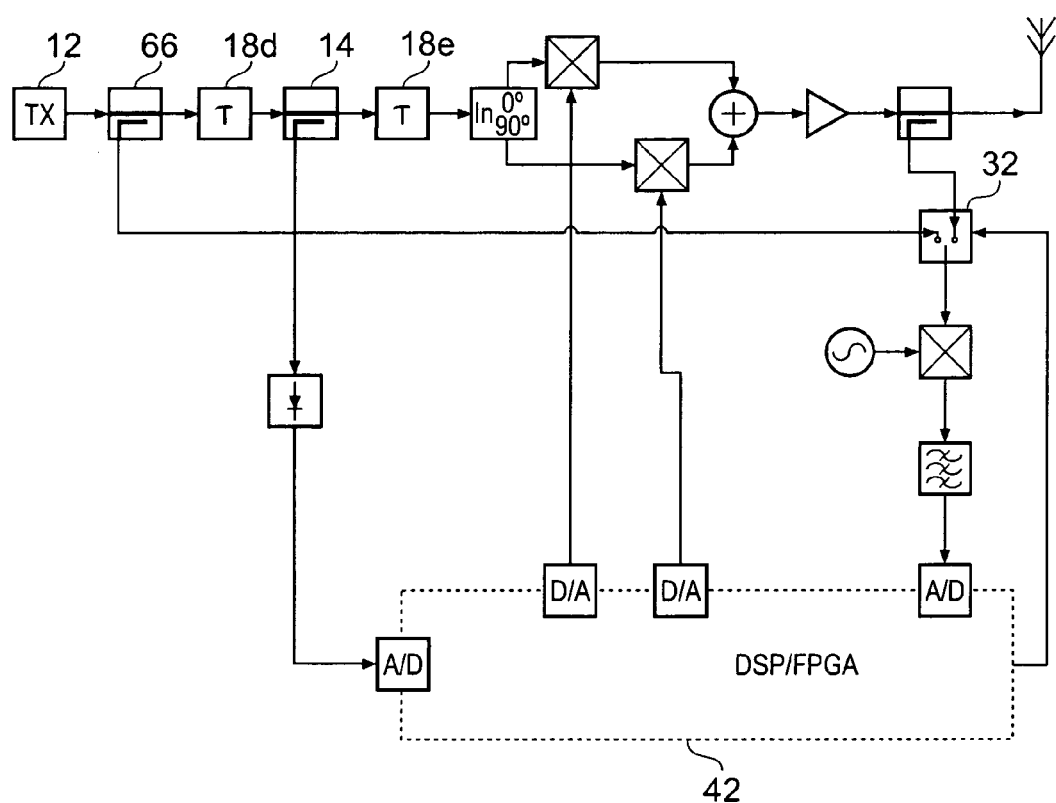
FIG. 5 is a block diagram of an RF signal processing scheme within a base station of a mobile telephone network.

FIG. 5 shows yet another alternative embodiment, in which the delay line 18 of FIG. 1 has been replaced by two delay elements 18d and 18e. The delay elements 18d and 18e are located in the MTP at the input and output of the splitter 14, respectively. An additional splitter 66 is included in the MTP between the transmitter 12 and the delay element 18d. The splitter 66 diverts a version of the transmitter output signal away from the MTP and supplies it to the switch 32. Hence, the system of FIG. 5 omits the splitter 30 of FIG. 1.

The arrangement of the delay elements in FIG. 5 facilitates the use of a SAW device for delay 18d. Since delay element 18d is located before the splitter 14 which provides the transmitter output signal envelope information to the DPF 42, the group-delay ripple specification and the amplitude and phase ripple specifications for the implementation of the delay 18d as an SAW device are significantly relaxed. The delay element 18e can be implemented as a coaxial delay line. The impact of group-delay ripple on the correction process for adjusting the look-up table values can be addressed by implementing a corrective filter technique within the DPF 42. In most other respects, the system of FIG. 5 is identical to that of FIG. 1.

Figure 6:
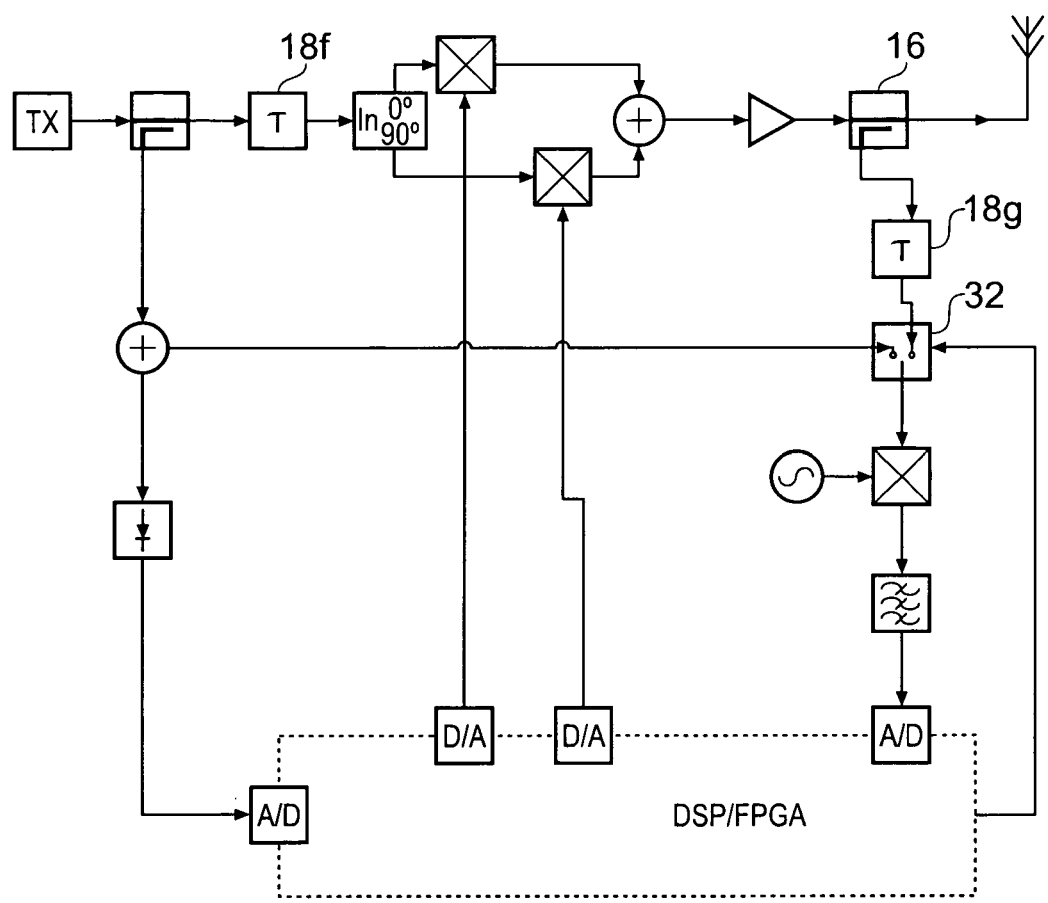
FIG. 6 is a block diagram of an RF signal processing scheme within a base station of a mobile telephone network.

FIG. 6 shows a further alternative embodiment in which the delay element 18 of FIG. 1 has been replaced by a delay element 18f and supplemented by a further delay element 18g. Delay element 18g operates on the version of the RFPA output signal that is diverted by splitter 16 towards the switch 32. The delay element 18g can be implemented using a SAW device although it will have to be capable of relatively high performance because any errors introduced by the delay element 18g (such errors being systematic and/or due to non-linearity in the response of the delay element) will be manifested in the version of the RFPA output signal that is sensed by switch 32 but will not be manifested in the version of the transmitter output signal that is sensed by switch 32. That is to say, errors arising from the delay element 18g will not be eliminated by the comparison step involved in the process of correcting the look-up table values carried out by the DSP within the DPF 42. In most other respects, the system of FIG. 6 is the same as that of FIG. 1.

Figure 7:
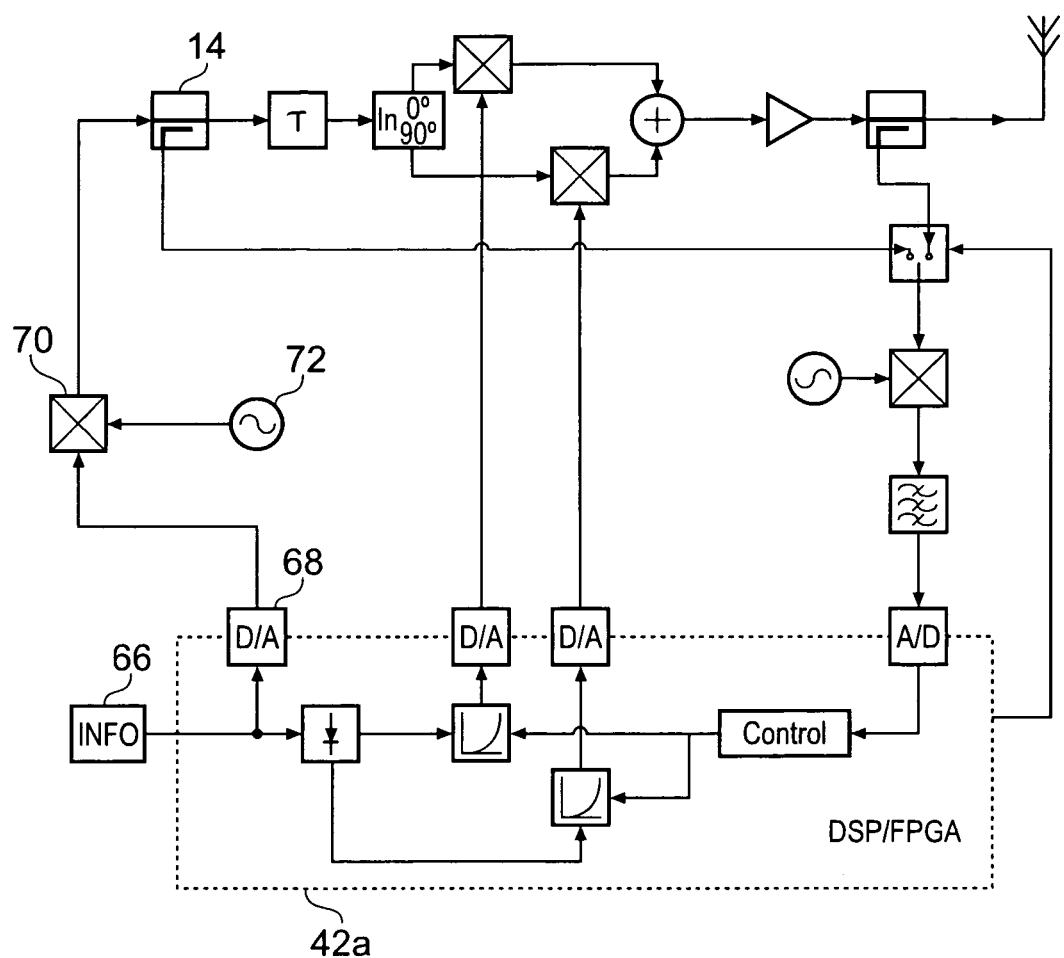
FIG. 7 is a block diagram of an RF signal processing scheme within a base station of a mobile telephone network.

Yet another embodiment is shown in FIG. 7. The embodiment of FIG. 7 differs from that of FIG. 1 primarily in that certain functionality of the transmitter 12 of FIG. 1 has been integrated with the DPF 42a. The system of FIG. 7 also includes an information source 66 which produces a baseband signal containing information (e.g. encoded digital speech) that is to be transmitted from the base station. The baseband signal is supplied to the DPF 42a where its envelope is detected. The values of the envelope of the baseband signal are used to index the look-up tables LUT-I and LUT-Q in order to generate the I and Q channel correction signals for application to the vector modulator in the MTP. The DPF 42a also includes a DAC 68 for converting the baseband signal into an analogue signal which is applied to a frequency up-converter that is schematically illustrated by mixer 70 and LO 72. The output of the up-converter is an RF signal at the desired transmission frequency and is applied to the input of splitter 14. The RF output signal of the up-converter is equivalent to the output signal of transmitter 12 in FIG. 1. In most other respects, the system shown in FIG. 7 is the same as that described with reference to FIG. 1.

Figure 8:
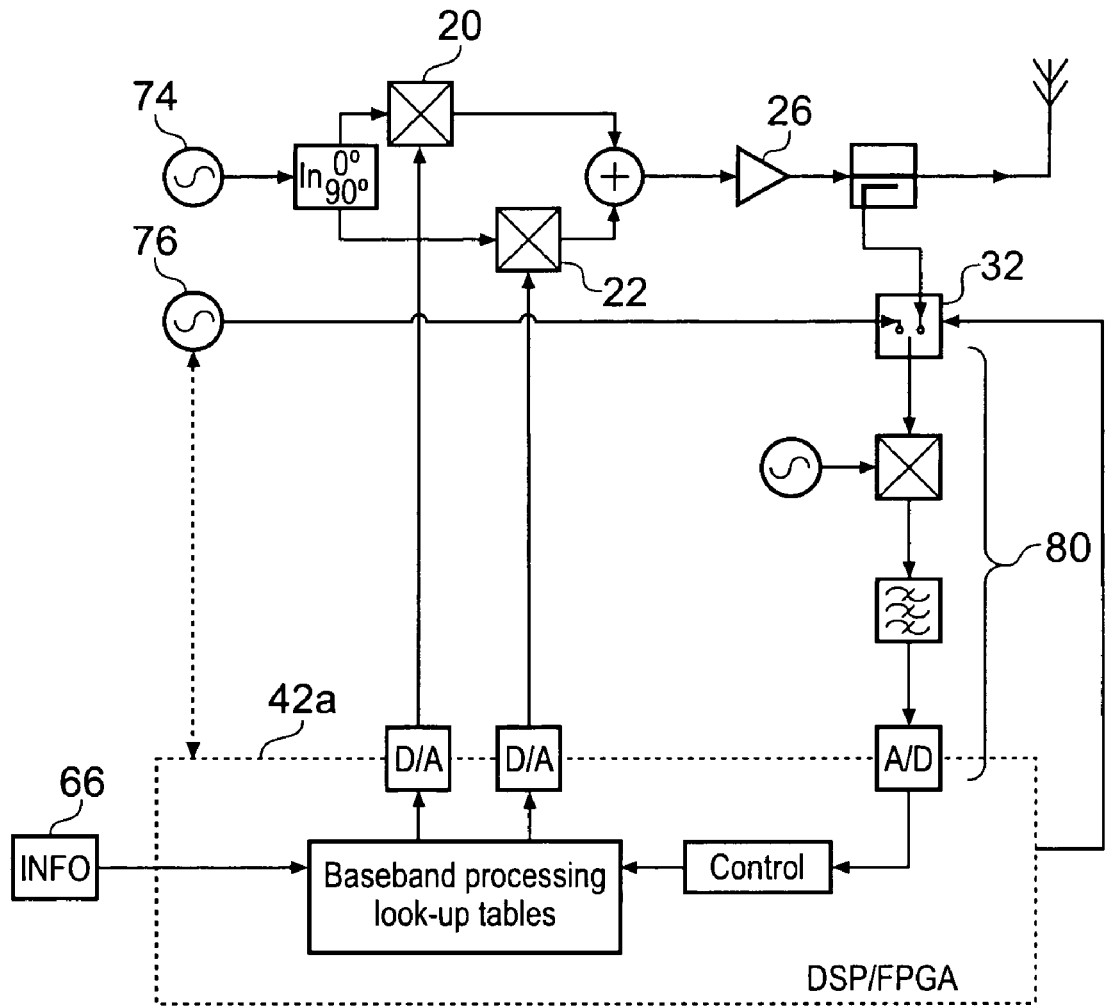
FIG. 8 is a block diagram of an RF signal processing scheme within a base station of a mobile telephone network.

FIG. 8 shows a variation of the architecture shown in FIG. 7. In FIG. 7, the baseband signal produced by the information source 66 is up-converted and supplied to the vector modulator. In FIG. 8, the vector modulator is supplied with a carrier signal produced by channel synthesiser 74 that outputs a carrier signal whose frequency is at the centre of the desired RF transmission channel.

The processes of modulating the baseband signal on to the output of the channel synthesiser and predistorting the input to the RFPA 26 are combined in the system of FIG. 8. The look-up tables in DPF 42a are addressed by the envelope of the baseband signal to produce control signals for application to the multipliers 20 and 22 in the vector modulator. The values that are stored in the look-up tables are calculated so that they introduce, at the vector modulator, the information from the baseband signal with an appropriate degree of predistortion.

Since the information from the baseband signal and the predistortion are introduced simultaneously to the input signal to the RFPA 26, it is not possible to provide a signal from the path leading to the RFPA 26 that could be compared with the output of the RFPA 26 to reveal residual distortion in the RFPA output signal. In previous embodiments, the comparison performed on signals acquired by the switch 32 from splitters 14 and 16 enabled errors arising in the path 80 from the switch 32 to the DPF 42a to be largely ignored. However, such a comparison cannot be performed in the system of FIG. 8 in the absence of a signal from the path leading to the RFPA 26 that could contribute to the comparison process.

In order to resolve this problem, the switch 32 receives a reference signal from a reference signal source 76 instead of a signal from the path leading to the RFPA 26. The DPF 42a can direct the switch 32 to send the signal from reference signal source 76 to the DPF 42a. The DPF 42a is given knowledge of the characteristics of the signal produced by the reference signal source 76 and is therefore able to measure the errors that arise in the down-conversion, filtering and analogue to digital conversion processes that are performed in the path leading from the switch 32 to the DPF 42a. The DPF 42a uses these error measurements to calibrate samples of the RFPA output signal that are obtained through switch 32. The calibrated samples can then be compared with the baseband signal from the information source 66 and any discrepancies that appear can be attributed to residual distortion in the RFPA output signal. In most other respects, the system shown in FIG. 8 is the same as that described with reference to FIG. 1.

Figure 10:
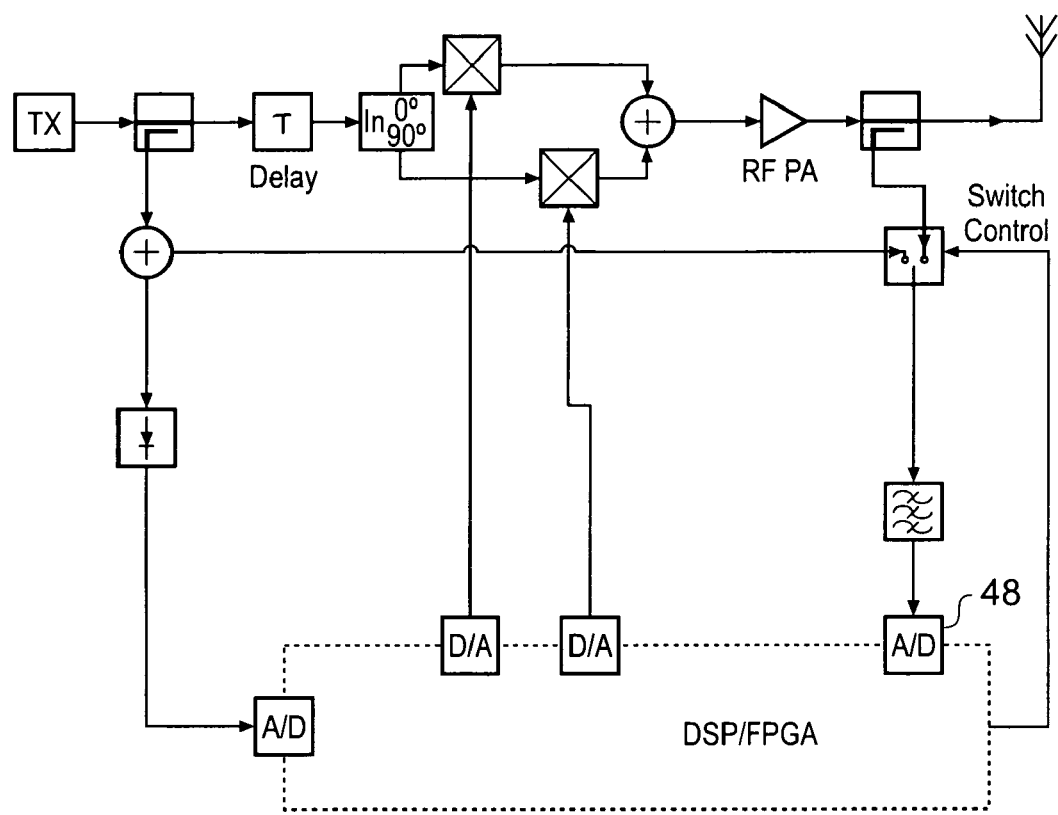
FIG. 10 is a block diagram of an RF signal processing scheme within a base station of a mobile telephone network.

FIG. 10 shows a variant of the architecture of FIG. 1 in which the down-converter signified by oscillator 36 and mixer 38 has been omitted. The ADC 48 is arranged to perform under-sampling of the signals that it receives from switch 32 in order to achieve down-conversion of those signals in place of the omitted down-converter. The lower sampling rate of the ADC 48 also permits direct sampling of relatively low frequency MTP signals that do not require down-conversion before reaching ADC 48. In most other respects, the system shown in FIG. 10 is the same as that described with reference to FIG. 1.

The invention claimed is:

1. Apparatus for sampling first and second signals within a signal processing arrangement, said apparatus comprising a sampler for sampling sections of the waveforms of both the first and second signals, a switch for alternating connection of the sampler to a point in the arrangement where said first signal can be sampled and a point in said arrangement where said second signal can be sampled and a timer for timing the operation of the switch to cause the sampler to sample a first waveform section of said first signal and a second waveform section of said second signal, wherein said second signal is responsive to said first signal and said timer is arranged to utilize a propagation delay between said points so that said second section at least comprises a portion that has been generated in response to said first section.

2. Apparatus according to claim 1, wherein said timer is arranged to time the operation of said switch such that said sampler samples said first and second sections consecutively.

3. Apparatus according to claim 1, further comprising a controller arranged to use the samples of the first and second sections to produce one or more control signals for application to said arrangement to control the operation of said arrangement.

4. Apparatus according to claim 3, wherein said controller comprises a memory for storing values derived from said samples and said controller is arranged to time-align those values that relate to said first signal with those values that relate to said second signal in preparation for deriving from said values said one or more control signals.

5. Apparatus according to claim 3, wherein said controller is arranged to obtain from said samples values of a parameter, to allocate said values into bins and to average the values within said bins.

6. Apparatus according to claim 3, wherein said controller is arranged to obtain from said samples values of a parameter, to allocate said values into bins and use ideal values of said parameter for said bins in order to assess the contents of the bins.

7. Apparatus according to claim 3, wherein the signal processing arrangement comprises an amplifier and at least one of said one or more control signals is for controlling the amount of distortion caused by the amplifier during its operation.

8. Apparatus according to claim 7, wherein said first signal is a signal to be amplified by said amplifier and said second signal is the result of amplifying said first signal using said amplifier.

9. A signal processing system comprising a signal processing arrangement, a sampler for sampling sections of the waveforms of first and second signals appearing within said arrangement, a switch for alternating connection of the sampler to a point in the arrangement where said first signal can be sampled and a point in said arrangement where said second signal can be sampled, a timer for timing the operation of the switch to cause the sampler to sample a first waveform section of said first signal and a second waveform section of said second signal and a controller for using the samples of the first and second sections to produce one or more control signals for application to said arrangement to control the operation of said arrangement, wherein said second signal is responsive to said first signal and said timer is arranged to utilize a propagation delay between said points so that said second section comprises at least a portion that has been generated in response to said first section.

10. A system according to claim 9, wherein said timer is arranged to time the operation of said switch such that said sampler samples said first and second sections consecutively.

11. A system according to claim 9, wherein said controller comprises a memory for storing values derived from said samples and said controller is arranged to time-align those values that relate to said first signal with those values that relate to said second signal in preparation for deriving from said values said one or more control signals.

12. A system according to claim 9, wherein said controller is arranged to obtain from said samples values of a parameter, to allocate said values into bins and to average the values within said bins.

13. A system according to claim 9, wherein said controller is arranged to obtain from said samples values of a parameter, to allocate said values into bins and use ideal values of said parameter for said bins in order to assess the contents of the bins.

14. A system according to claim 9, wherein the signal processing arrangement comprises an amplifier and at least one of said one or more control signals is for controlling the amount of distortion caused by the amplifier during its operation.

15. A system according to claim 14, wherein said first signal is a signal to be amplified by said amplifier and said second signal is the result of amplifying said first signal using said amplifier.

* * * * *